United States Patent [19]

Marsh et al.

[11] Patent Number: 5,412,356

[45] Date of Patent: May 2, 1995

[54] DIGITAL INTERFACE CABLE

[75] Inventors: Richard N. Marsh, Cool; Bruce A. Brisson, Auburn, both of Calif.

[73] Assignee: Constant Velocity Transmission Lines, Inc., Auburn, Calif.

[21] Appl. No.: 966,313

[22] Filed: Oct. 26, 1992

[51] Int. Cl.⁶ .............................................. H03H 7/00
[52] U.S. Cl. .................................. 333/167; 333/174; 333/24 C
[58] Field of Search ....................... 333/24 C, 167, 168, 333/174

[56] References Cited

U.S. PATENT DOCUMENTS

| | | | |
|---|---|---|---|
| 3,848,164 | 11/1974 | Otte | 333/24 C |
| 4,319,207 | 3/1982 | Gignoux | 333/174 |
| 4,987,391 | 1/1991 | Kusiak, Jr. | 333/24 C |
| 5,260,862 | 11/1993 | Marsh | 333/174 |

Primary Examiner—Robert J. Pascal
Assistant Examiner—Darius Gambino
Attorney, Agent, or Firm—Fliesler, Dubb, Meyer & Lovejoy

[57] ABSTRACT

A single-ended digital interface cable and a balanced digital interface cable having a source end and a load end for propagating audio frequency signals in a digital format is disclosed. Each of the cables comprises a fixed capacitor or a capacitor and switch network which is coupled at or near the load end of the cables for providing a fixed bandwidth or for use in selectively controlling the bandwidth of the cables and a series resistance at each end thereof to dampen ringing.

22 Claims, 3 Drawing Sheets

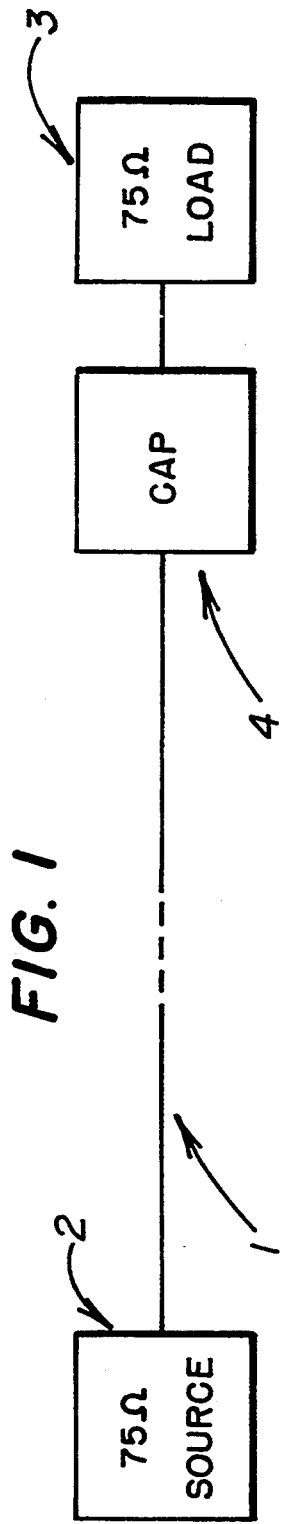
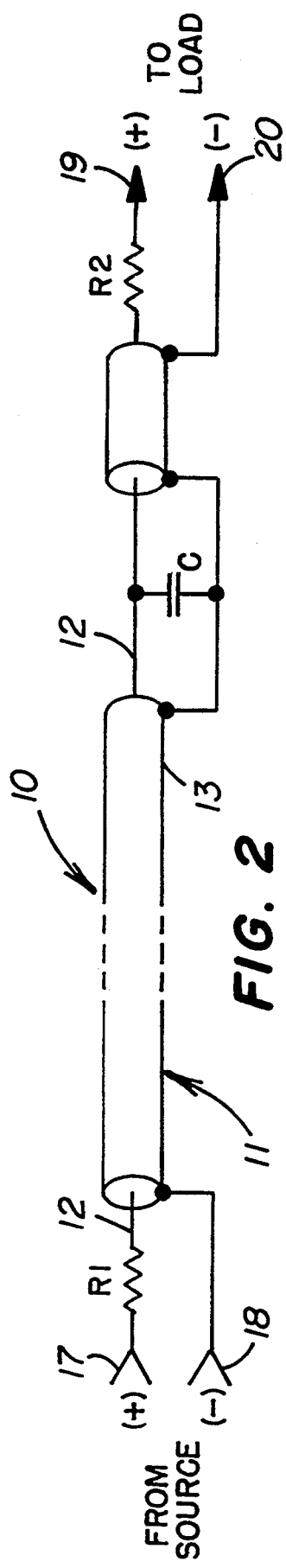
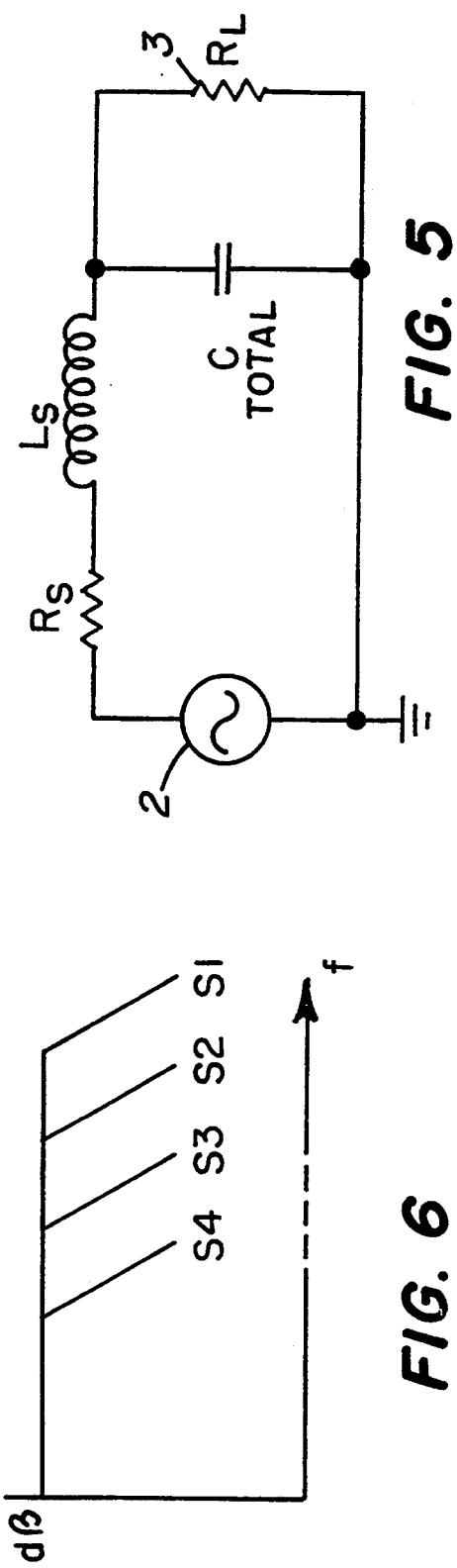
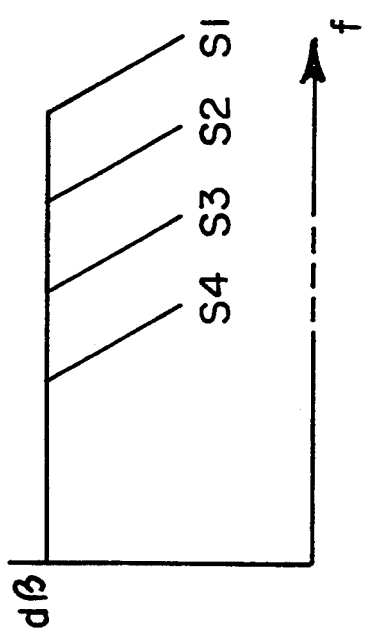
FIG. 1
FIG. 2
FIG. 5
FIG. 6

DIGITAL INTERFACE CABLE

BACKGROUND OF THE INVENTION

1. Field of the Invention

The present invention relates to cables for interfacing audio signal sources and loads in an audio system in general and in particular to single-ended and balanced digital signal cables for propagating audio signals in a digital format between a source of digitized audio signals and a load, such as a compact disk player, digital-to-analog and analog-to-digital converters, a digital audio tape (DAT) recorder, and the like.

2. Description of the Related Art

As digital components, e.g. compact disk players, digital-to-analog (D/A) and analog-to-digital (A/D) converters, digital audio tape (DAT) players, and the like, have been added to otherwise conventional analog signal audio systems, the cables used for interconnecting the digital components have generally been the same type of cables used for interconnecting the analog signal components. However, the use of analog signal cables for this purpose has been found to be unsatisfactory.

The requirements for interfacing digital components in an audio system have been found to be stringent because of the presence in such components of circuits that provide very fast signal-level transitions, i.e. risetimes, e.g. 10 nanoseconds (ns), and have very wide bandwidths, e.g. 20 to 50 megahertz (MHz).

As a consequence, it has been found that conventional analog signal cable, even analog signal cable designed for use in very expensive, high quality analog audio signal systems, typically cannot adequately propagate digital signals. One of the reasons for this is believed to be due to the relatively low capacitive impedance of conventional analog signal cables.

It has been found that among the disadvantages of an analog signal cable which has a relatively high capacitive impedance are the disadvantages that, as the capacitive impedance decreases, the bandwidth of the cable may become undesirably narrow and the risetime of the signals applied to the cable may become undesirably long, particularly if the signals are digital signals. When the signals are digital signals an undesirably narrow bandwidth and an undesirably long signal risetime can result in signal jitter in the circuit or system component receiving the signals. This is due to the fact that the circuit or system component receiving the signals has a difficult time determining if and when the received signal has made a transition between a logical low and a logical high, i.e. "1" or "0". To a listener of music, for example, signal jitter is heard as distortion of the music or other audio signal or as a lack of clarity in the reproduction of the detail in the source material.

Another disadvantage of using a cable designed for propagating analog signals to interconnect digital components in an audio system is related to impedance matching which, while important in interfacing analog components, is even more important in interfacing digital components. If the output impedance of one digital component is not matched to the input impedance of another, the high frequency, high-speed digital signal will reflect at the point of impedance change. These reflections cause errors in the detection of the music or other audio signal by the receiving unit, creating "false" signals. Once again, a listener will hear or interpret the false signals as a lack of clarity or distortion in the music or other audio signal. But, even more serious is the fact that these anomalies can, if they are severe enough, create actual drop-out of the source material data, which is heard as audible and disturbing distortions in the harmonic relationships in the material.

Another disadvantage of conventional cables designed for propagating analog signals and, for that matter, conventional cables which are currently being used for propagating digital signals is that none of the conventional cables now being used is tuned or comprises means for being tuned to the bandwidth of typical digital signal sources now being used in audio systems. This is important because, if a digital signal cable is tuned or comprises means for being tuned to the bandwidth of a digital signal source, the performance of the cable can be maximized with a minimum of unwanted coupled noise.

SUMMARY OF THE INVENTION

In view of the foregoing, a principal object of the present invention is a digital interface cable for interconnecting digital components in an audio system which is tuned to comprise a predetermined bandwidth of a typical source of audio signals in a digital format or comprises means for tuning the cable to the bandwidth of a signal source of audio signals in a digital format to which it is coupled.

In accordance with the above objects there is provided in one embodiment of the present invention a single-ended digital interface cable comprising a length of coaxial cable having a predetermined characteristic impedance, e.g. 75 ohms, which corresponds to the characteristic impedance of typical sources of audio signals in a digital format and loads coupled thereto, a relatively low distributed capacitance, e.g. less than 20 picofarads/foot (pf/ft), and a discrete capacitor having a predetermined capacitance, e.g. 90 pf, coupled between the center conductor and the shield thereof near the load end of the cable. In this embodiment the bandwidth of the cable is fixed so that it corresponds to the bandwidth of typical sources of audio signals in a digital format and loads coupled thereto in many audio systems.

In another embodiment of a single-ended digital cable according to the present invention there is provided a coaxial cable as described above and a capacitor-switch network comprising a plurality of discrete capacitors near the load end of the cable. The capacitors are provided to be selectively coupled in parallel between the center conductor and the shield, i.e. outer conductor, of the cable by means of a corresponding number of switches. For example, in a typical embodiment comprising a cable one (1) meter in length there may be four discrete capacitors having a capacitance comprising 47 pf, 90 pf, 180 pf and 390 pf, respectively.

The magnitude of the total capacitance which is coupled between the center conductor and the shield of the cable by means of the switches depends on the bandwidth of the source of the audio signals in a digital format coupled thereto. In practice the magnitude of the total capacitance, including the distributed capacitance, is chosen such that the bandwidth of the cable corresponds to the bandwidth of the digital signal source. By adjusting the bandwidth of the cable to correspond to the bandwidth of the digital signal source, maximum cable performance is achieved with a minimum of coupled noise.

In each of the above-described embodiments of a single-ended digital cable according to the present invention, resistors having a predetermined resistance, e.g. 5 ohms, are provided in series with and at each end of the center conductor of the cable to reduce or prevent ringing of the cable due to the distributed inductance of the cable. Similarly, a resistor having a predetermined resistance, e.g. 0.33 to 0.47 ohms, is provided in series with the capacitor-switch network and the shield to provide critical damping of any ringing due to parasitic inductance in the capacitor-switch network.

In another embodiment of the present invention there is provided a balanced digital interface cable comprising a pair of coaxial cables, each coaxial cable having a predetermined characteristic impedance, e.g. 75 ohms, which corresponds to the characteristic impedance of typical audio signal sources in a digital format and loads coupled thereto, and a relatively low distributed capacitance of less than 20 pf/ft. In this embodiment the pair of coaxial cables are enclosed within a surrounding ground shield.

Coupled between the center conductors of the coaxial cables and near the load end thereof there is provided a capacitor-switch network comprising a plurality of discrete capacitors. The capacitors are provided to be selectively coupled in parallel between the center conductors of the pair of coaxial cables by means of a corresponding number of switches as described above with respect to the single-ended cable. However, because there is twice the distributed capacitance in the balanced cable, the magnitude of the capacitance of each of the capacitors in the capacitor network is typically one half the value of the capacitance used in conjunction with the single-ended cable. For example, in a typical embodiment comprising a cable one (1) meter in length there may be four discrete capacitors comprising 23.5 pf, 45 pf, 90 pf and 195 pf, respectively.

As described above with respect to the single-ended cable, the magnitude of the total capacitance which is coupled between the center conductors of the pair of coaxial cables by means of the switches depends on the magnitude of the distributed capacitance and the bandwidth of the source of audio signals in a digital format coupled thereto and in practice it is chosen such that the bandwidth of the cable corresponds to the bandwidth of the digital signal source. By adjusting the bandwidth of the cable to correspond to the bandwidth of the digital signal source, maximum cable performance is achieved with a minimum of coupled noise.

In the above-described embodiment of a balanced digital cable according to the present invention, a resistor having a predetermined resistance, e.g. 3 to 5 ohms, is provided in series with and at each end of the center conductor of each of the coaxial cables to reduce or prevent ringing of the cables due to the distributed inductance of the cables.

One of the advantages of the balanced digital cable relative to the single-ended cable is that the balanced digital cable maintains a balance, i.e. the impedance between each of the coaxial conductors and ground remains equal, while the bandwidth of the cable is being changed by the capacitors in the capacitor-switch network.

Another advantage of the balanced digital cable relative to the single-ended cable is that the balanced digital cable is more noise resistant than the single-ended cable. This is because the shield surrounding the pair of coaxial cables is not used as a signal return as is required in the single-ended cable and therefore the balanced cable is less susceptible to radio frequency interference (RFI).

BRIEF DESCRIPTION OF THE DRAWINGS

The above and other objects, features and advantages of the present invention will become apparent from the following detailed description of the accompanying drawings, in which:

FIG. 1 is a block diagram of a digital interface cable according to the present invention;

FIG. 2 is a schematic diagram of an embodiment of a single-ended digital interface cable according to the present invention;

FIG. 5 is a schematic diagram of an equivalent circuit according to the present invention; and FIG. 6 is a diagram representing bandwidth as a function of frequency for various configurations of the capacitor-switch network according to the present invention.

DESCRIPTION OF THE PREFERRED EMBODIMENTS

Figure 3:
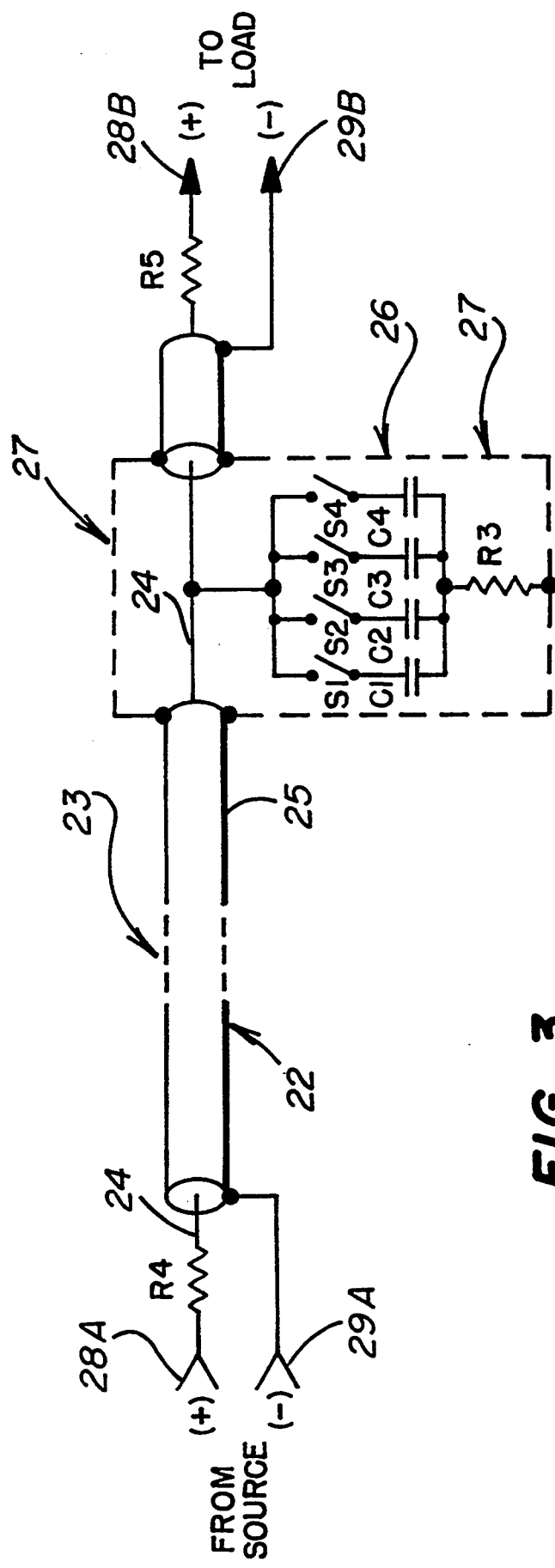
FIG. 3 is a schematic diagram of another embodiment of a single-ended digital interface cable according to the present invention.

Referring to FIG. 1, there is provided in accordance with the present invention a digital interface cable designated generally as 1 coupled to a source 2 and a load 3. The source 2 comprises a source of audio signals in a digital format having an output impedance of 75 ohms. The load 3 comprises a load for receiving the audio signals in the digital format from the source 2 and comprises an input impedance of 75 ohms. In the cable 1 there is provided a capacitor network designated generally as 4.

As will be further described below with respect to FIGS. 2, 3 and 4, the cable 1 comprises either a single-ended digital interface cable having a fixed or adjustable bandwidth or a balanced digital interface cable having an adjustable bandwidth.

Referring to FIG. 2, there is provided in accordance with the present invention a single-ended digital interface cable designated generally as 10. In the cable 10 there is provided a length of coaxial cable designated generally as 11 comprising an inner conductor 12 and an outer conductor 13. Coupled at or near the load end of the coaxial cable 11 between the inner conductor 12 and the outer conductor 13 there is provided a capacitor C.

Coupled in series with the center conductor 12 at the source and load ends thereof there is further provided a pair of resistors R1 and R2, respectively.

The source end of the cable 2 is provided with an RCA-type connector for coupling the cable 10 to the positive and negative terminals of the source 2, as shown by the feathers 17 and 18, respectively. The load end of the cable 10 is also provided with an RCA-type connector for connecting the load end of the cable 10 to the positive and negative terminals of load, as shown by the arrowheads 19 and 20, respectively.

In a typical embodiment of the present invention the coaxial cable 11 comprises a characteristic impedance of 75 ohms and has a relatively low distributed capacitance of less than 20 picofarads/foot (pf/ft), such as the coaxial cable commercially available and designated as BELDEN 9259 and the resistors R1 and R2 are typically 3 ohms to 5 ohms.

The magnitude of the capacitor C depends on the magnitude of the distributed capacitance of the cable 10 and the bandwidth of the source of audio signals in a digital format to which the cable 10 is coupled. In practice, the magnitude of the capacitor C is chosen such that the bandwidth of the cable corresponds to the bandwidth of the majority of digital signal sources normally coupled to the cable so that the cable will provide maximum performance with minimum coupled noise. For example, it has been found that a magnitude of 90 pf for the capacitance of the capacitor C provides the desired cable bandwidth in many systems using typical sources of audio signals in a digital format.

Referring to FIG. 3, there is provided in another embodiment of the present invention a single-ended digital interface cable designated generally as 22. In the cable 22 there is provided a length of coaxial cable designated generally as 23 comprising an inner conductor 24 and an outer conductor 25. Coupled at or near the load end of the coaxial cable 23 there is provided a capacitor-switch network designated generally as 26. In the capacitor-switch network 26 there is provided a plurality of discrete capacitors C1, C2, C3 and C4. Each of the capacitors C1–C4 are selectively coupled in parallel between the center conductor 24 and the outer conductor 25 by means of a plurality of switches S1, S2, S3 and S4, respectively, a resistor R3 and a metallic enclosure 27 in which the capacitors C1–C4 and switches S1–S4 are located.

Coupled in series with the center conductor 24 at the source and load ends thereof there is further provided a pair of resistors R4 and R5, respectively.

The source end of the cable 22 is provided with an RCA-type connector for coupling the cable 22 to the positive and negative terminals of the source 2, as shown by the feathers 28A and 29A, respectively. The load end of the cable 22 is also provided with an RCA-type connector for connecting the load end of the cable 22 to the positive and negative terminals of load, as shown by the arrowheads 28B and 29B, respectively.

In a typical embodiment of the present invention the coaxial cable 23 comprises a characteristic impedance of 75 ohms and has a distributed capacitance of less than 20 picofarads/foot (pf/ft), such as the coaxial cable commercially available and designated as BELDEN 9259, the resistors R4 and R5 are typically 3 ohms to 5 ohms. The resistor R3 is typically 0.33 ohms to 0.47 ohms. The capacitors C1–C4 comprise 47 pf, 90 pf, 180 pf, and 390 pf, respectively.

Figure 4:
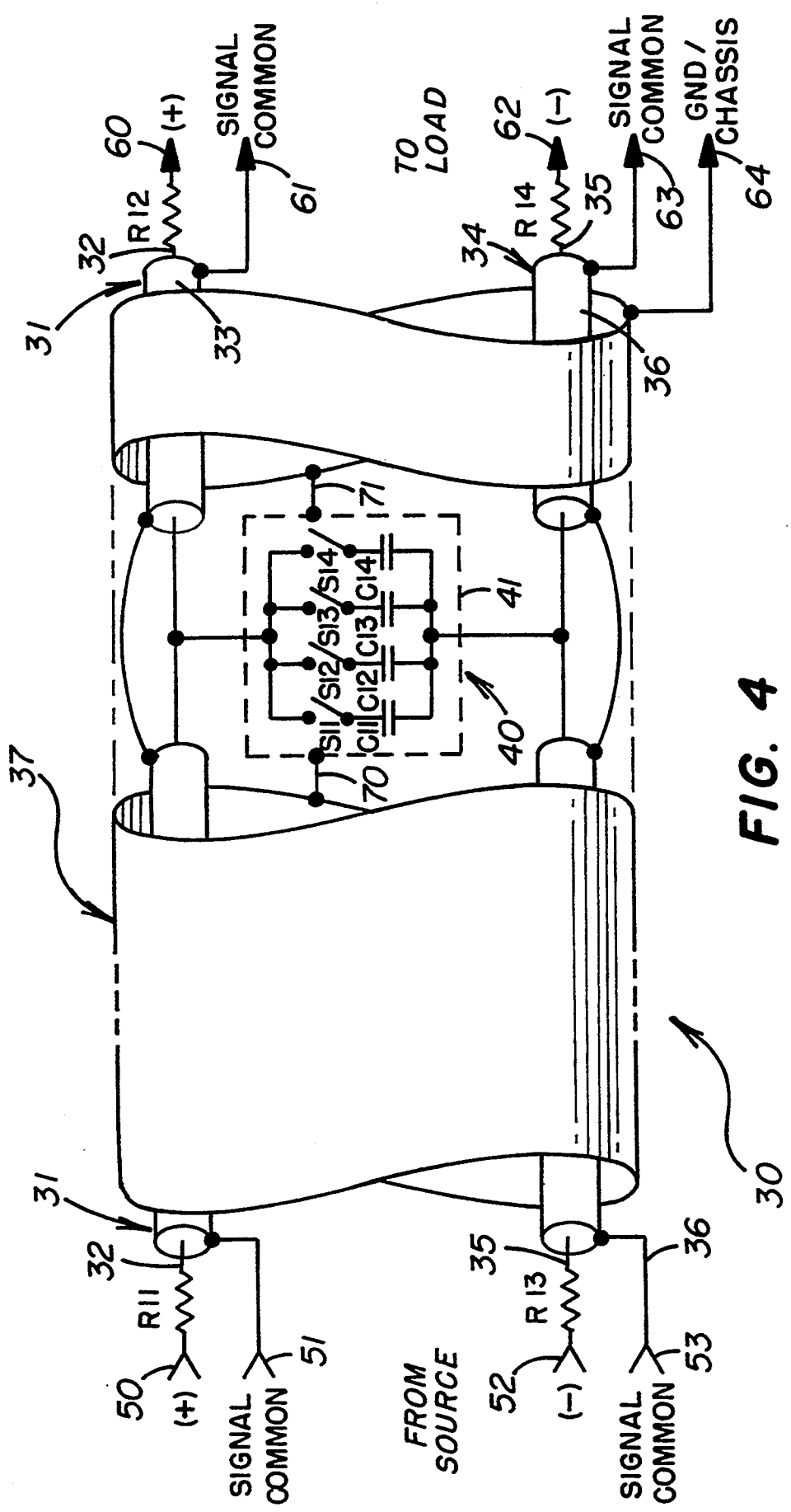
FIG. 4 is a schematic diagram of a balanced digital interface cable according to the present invention.

Referring to FIG. 4, there is provided in another embodiment of the present invention a balanced digital interface cable designated generally as 30. In the cable 30 there is provided a first coaxial cable designated generally as 31 having an inner conductor 32 and an outer conductor 33, and a coaxial cable designated generally as 34 having an inner conductor 35 and an outer conductor 36. Coaxial cables 31 and 36 are enclosed in a metallic shield designated generally as 37.

Coupled between the inner conductors 32 and 35 of the cables 31 and 34 there is provided at or near the load in thereof a switch-capacitor network designated generally as 40. In the network 40 there is provided a plurality of discrete capacitors C11, C12, C13 and C14 which are coupled in parallel between the inner conductors 32 and 35 by means of a plurality of switches S11, S12, S13 and S14, respectively. The capacitors C11–C14 and switches S11–S14 are mounted in a metallic enclosure designated generally as 41.

Coupled in series with the inner conductor 32 of the cable 31 there is provided at the source and load end thereof a pair of resistors R11 and R12, respectively. Coupled in series with the center conductor 35 of the cable 34 there is provided at the source and load ends thereof a pair of resistors R13 and R14, respectively.

The source end of the inner conductor 32 and outer conductor 33 of the cable 31, as shown by the feathers 50 and 51, the source end of the inner conductor 35 and outer conductor 36, as shown by the feathers 52 and 53, are terminated by an XLR-type connector for connecting the cable 30 to the positive, negative and signal common terminals of a source of audio signals in a digital format. The load end of the inner conductor 32 and outer conductor 33 of the cable 31, as shown by the feathers 60 and 61, respectively, the inner conductor 35 and the outer conductor 36 of the cable 34, as shown by the feathers 62 and 63, respectively, and the outer shield 37, as shown by the feather 64, are terminated by an XLR-type connector for connecting the load end of the cable 30 to the positive, negative, common signal and ground/chassis terminals of a load.

To shield the network 40, the metallic enclosure 41 is electrically coupled to the outer shield 37 as shown by the lines 70 and 71.

In a typical embodiment of the cable 30 the magnitude of the resistances R11–R12 is typically 3 ohms to 5 ohms and, due to the fact that the distributed capacitance in the balanced cable 30 is twice the distributed capacitance in the single-ended cable 10, the magnitude of the capacitance of the capacitors C11–C14 is approximately one-half the value of the magnitude of the capacitance of the capacitors C1–C4 for the same length of cable. Accordingly, in a typical embodiment of the cable 30 comprising a length of one (1) meter, the capacitance C11–C14 comprise 23.5 pf, 45 pf, 90 pf, and 195 pf, respectively. Each of the coaxial cables 31 and 34 comprise a 75 ohm characteristic impedance, have a distributed capacitance of less than 20 pf/ft and are equivalent to a coaxial cable commonly known and commercially available as BELDEN 9259.

Referring to FIG. 5, there is shown an equivalent circuit 50 of the cables 10, 22 and 30 coupled to a source 2 and a load 3. In the equivalent circuit there is provided a series resistance $R_s$, a series inductance $L_s$ and coupled in parallel with the load 3 there is provided a capacitance C. In practice, the total capacitance C of the circuit of FIG. 4 includes the distributed capacitance of the cables 10, 22 or 30 and the capacitance added to the cables by the capacitance C of FIG. 2 or the capacitance added by the capacitor-switch networks 26 or 40. Thus, as capacitance is added to the cables 22 and 30 the bandwidth of the cables decreases such that as each of the switches S1–S4 and S11–S14 is closed, the bandwidth narrows as shown in FIG. 6.

As discussed above, the magnitude of the capacitance added to the cables 23 and 30 is preferably that amount of capacitance which provides the cables 23 or 30 a bandwidth which corresponds to the bandwidth of the source 2 of audio signals in a digital format. If the bandwidth is too narrow, the signals from the source 2 are cut off and, if the bandwidth is too wide, the cables are more susceptible of picking up radio frequency interference. Of course, it will be recognized that the cable 30 of FIG. 3 is less susceptible to picking up radio frequency interference due to the external outer shield 37 which surrounds and encloses the signal carrying cables 32 and 34.

While preferred embodiments of the present invention are described above, it is contemplated that numerous modifications may be made thereto for particular applications without departing from the spirit and scope of the present invention. For example, the RCA-type and XLR-type connectors which are described above for connecting the cables to a load and source may be replaced by other types of suitable connectors. Accordingly, it is intended that the embodiments described be considered only as illustrative of the present invention and that the scope thereof should not be limited thereto but be determined by reference to the claims hereinafter provided.

What is claimed is:

1. A cable having a source end and a load end for propagating audio frequency signals in a digital format comprising:

means for coupling the source end of the cable to a source of audio signals in a digital format;

means for coupling the load end of the cable to a load; and means including a discrete capacitor capacitance the magnitude of which is a function of the magnitude of said distributed capacitance and which is coupled to the cable between the source and load ends thereof for providing the cable with a predetermined bandwidth and the magnitude of said predetermined capacitance of said discrete capacitor.

2. A cable according to claim 1 wherein said predetermined bandwidth corresponds to the bandwidth of the source of audio frequency signals to which the cable is connected.

3. A cable having a center conductor, an outer conductor, a source end and a load end for propagating audio frequency signals in a digital format comprising:

means for coupling the source end of the cable to a source of audio signals in a digital format;

means for coupling the load end of the cable to a load; and an electrically conductive enclosure;

a plurality of discrete capacitors housed within and electrically coupled to said enclosure;

means within and electrically coupled to said enclosure for selectively coupling selected ones of said plurality of capacitors between said center conductor and said outer conductor for providing the cable with a predetermined bandwidth; and means for electrically coupling said electrically conductive enclosure and the outer conductor.

4. A coaxial cable having a center conductor, an outer shield, a source end and a load end for propagating audio frequency signals in a digital format comprising:

means for coupling the source end of the cable to a source of audio signals in a digital format;

means for coupling the load end of the cable to a load;

at least four discrete capacitors having a capacitance of 47 pf, 90 pf, 180 pf and 390 pf, respectively; and means for selectively coupling selected ones of said plurality of capacitors in parallel between said center conductor and said outer conductor for providing the cable with a predetermined bandwidth.

5. A coaxial cable having a center conductor, an outer shield, a source end and a load end for propagating audio frequency signals in a digital format comprising:

means for coupling the source end of the cable to a source of audio signals in a digital format;

means for coupling the load end of the cable to a load;

a plurality of discrete capacitors;

means for selectively coupling selected ones of said plurality of capacitors between said center conductor and said outer conductor for providing the cable with a predetermined bandwidth; and a pair of resistors having a magnitude of from 3 ohms to 5 ohms which are coupled to each end of said center conductor for damping ringing.

6. A coaxial cable having a center conductor, an outer shield, a source end and a load end for propagating audio frequency signals in a digital format comprising:

means for coupling the source end of the cable to a source of audio signals in a digital format;

means for coupling the load end of the cable to a load;

a plurality of discrete capacitors;

means for selectively coupling selected ones of said plurality of capacitors between said center conductor and said outer conductor for providing the cable with a predetermined bandwidth; and a resistance having a magnitude of from 0.33 ohms to 0.47 ohms in series with said plurality of capacitors for damping ringing.

7. A cable having a source end and a load end for propagating audio frequency signals in a digital format comprising:

a first coaxial cable having a center conductor and an outer conductor;

a second coaxial cable having a center conductor and an outer conductor;

means for coupling the source end of the first and second coaxial cables to a source of audio signals in a digital format;

means for coupling the load end of the first and second coaxial cables to a load; and means including a discrete capacitor having a predetermined capacitance which is coupled between said center conductors of said first and second coaxial cables near the load end thereof for providing the cable with a predetermined bandwidth.

8. A cable having a source end and a load end for propagating audio frequency signals in a digital format according to claim 1, comprising:

XLR-TYPE connecting means for coupling the source end of the cable to a source of audio signals in a digital format;

XLR-TYPE connecting means for coupling the load end of the cable to a load.

9. A cable having a source end and a load end for propagating audio frequency signals in a digital format comprising:

a first coaxial cable having a center conductor and an outer conductor;

a second coaxial cable having a center conductor and an outer conductor;

means for coupling the source end of the first and second coaxial cable to a source of audio signals in a digital format;

means for coupling the load end of the first and second coaxial cable to a load;

a plurality of discrete capacitors; and means for selectively coupling selected ones of said plurality of capacitors between said center conductors of said first and second coaxial cables for providing the cable with a predetermined bandwidth.

10. A cable having a source end and a load end for propagating audio frequency signals in a digital format comprising:
   a first coaxial cable having a center conductor and an outer conductor;
   a second coaxial cable having a center conductor and an outer conductor, said first and second coaxial cables being housing within an electrically conductive enclosure;
   means for coupling the source end of the first and second coaxial cable to a source of audio signals in a digital format;
   means for coupling the load end of the first and second coaxial cable to a load;
   a plurality of discrete capacitors; and
   means for selectively coupling selected ones of said plurality of capacitors between said center conductors of said first and second coaxial cables for providing the cable with a predetermined bandwidth.

11. A cable having a source end and a load end for propagating audio frequency signals in a digital format according to claim 1, comprising:
   RCA-TYPE connecting means for coupling the source end of the cable to a source of audio signals in a digital format;
   RCA-TYPE connecting means for coupling the load end of the cable to a load.

12. A cable according to claim 1 wherein said predetermined capacitance of said discrete capacitor comprises approximately 90 picofarads (pf).

13. A cable according to claim 6 wherein the magnitude of said predetermined capacitance of the discrete capacitor is approximately 45 pf.

14. A cable according to claim 8 wherein said means for selectively coupling selected ones of said plurality of capacitors between said center conductors of said first and second coaxial cables comprises means for selectively coupling selected ones of said plurality of capacitors in parallel between said center conductors of said first and second coaxial cables.

15. A cable according to claim 14 wherein said means for selectively coupling selected ones of said plurality of capacitors in parallel between said center conductors of said first and second coaxial cables comprises switch means.

16. A cable according to claim 14 wherein said plurality of capacitors comprises four discrete capacitors having a capacitance of 23.5 pf, 45 pf, 90 pf and 195 pf, respectively.

17. A cable according to claim 8 comprising means coupled in series with the center conductors of said first and second coaxial cables for damping ringing.

18. A cable according to claim 17 wherein said means coupled in series with the center conductors of said coaxial cables for damping ringing comprises means for providing a resistance in series with said center conductors.

19. A cable according to claim 18 wherein said resistance providing means comprises a resistor having a magnitude of from 3 ohms to 5 ohms which is coupled to each end of said center conductors.

20. A cable according to claim 9 wherein said means for selectively coupling selected ones of said plurality of capacitors between said center conductors of said first and second coaxial cables comprises a corresponding number of switch means.

21. A cable according to claim 9 wherein said plurality of capacitors comprises four discrete capacitors having a capacitance of 23.5 pf, 45 pf, 90 pf and 195 pf, respectively.

22. A cable according to claim 9 comprising:
   means for coupling the source end of the center conductors of said first and second coaxial cables to the positive and negative terminals and the outer conductors of said first and second coaxial cables to the signal common terminal of a source of audio signals in a digital format, respectively; and
   means for coupling the load end of the center conductors of said first and second coaxial cables to the positive and negative terminals, and the load end of the outer conductors of said first and second coaxial cables to the signal common terminal, and the load end of the metallic shield to the ground/chassis terminal of a load.

* * * * *